United States Patent
Wensley et al.

(10) Patent No.: US 6,316,310 B1
(45) Date of Patent: Nov. 13, 2001

(54) METHOD OF FORMING A BURIED PLATE

(75) Inventors: Paul Wensley, Morpeth (GB); Guenther Koffler, Villach (AT)

(73) Assignee: Siemens Microelectronics Limited (GB)

( * ) Notice: Subject to any disclaimer, the term of this patent is extended or adjusted under 35 U.S.C. 154(b) by 0 days.

(21) Appl. No.: 09/449,362

(22) Filed: Nov. 24, 1999

(30) Foreign Application Priority Data

Nov. 26, 1998 (GB) .................................................. 9825779

(51) Int. Cl.⁷ ......................... H01L 21/8242; H01L 21/20
(52) U.S. Cl. ........................... 438/249; 438/392; 438/561
(58) Field of Search ................................. 438/392, 561, 438/249

(56) References Cited

U.S. PATENT DOCUMENTS 5,618,751 * 4/1997 Golden et al. ...................... 438/392
6,057,216 * 5/2000 Economikos et al. ............... 438/559
6,096,598 * 8/2000 Furukawa et al. ................... 438/249

OTHER PUBLICATIONS

Copy of Search Report from the U.K. Patent Office. No date.

* cited by examiner

*Primary Examiner*—John F. Niebling
*Assistant Examiner*—Jennifer M. Kennedy

(57) ABSTRACT

Known methods for forming trench storage capacitors require the chemical vapour deposition (CVD) of an undoped silicon oxide layer in order to prevent auto doping of side wall of a semiconductor trench. This layer is deposited once an arsenic doped silicon oxide layer has been disposed and etched to an appropriate depth. Such a technique results in a complex and expensive process. It is therefore proposed to deposit (step 906) the undoped silicon oxide layer 108 in-situ immediately after the arsenic doped silicon oxide layer 106 has been deposited (step 904) and before etching takes place (step 910). It is thus possible to remove the CVD of the undoped silicon oxide, thereby simplifying the overall process and yielding a device having improved performance characteristics.

6 Claims, 3 Drawing Sheets

METHOD OF FORMING A BURIED PLATE

BACKGROUND OF THE INVENTION

The present invention relates to a method of forming a buried plate, for example, in a semiconductor device, such as, a trench storage capacitor.

When forming a buried plate in a silicon trench, a layer of arsenic doped glass ($SiO_2$) is disposed over a lower portion of the side walls of the trench using a Low Pressure Chemical Vapour Deposition (LPCVD) technique. The arsenic doped glass layer, when annealed, results in the diffusion of the arsenic into the silicon trench. However, in order to avoid increasing parasitic leakage currents along side walls of the trench, diffusion of the arsenic needs to be restricted to the lower portion of the trench, thereby avoiding diffusion of arsenic into the whole of the side walls of the silicon trench. It is therefore known to deposit an undoped glass layer over the trench using a Plasma Chemical Vapour Deposition (CVD) technique. The undoped glass layer completely covers the side walls and the arsenic doped glass layer in order to prevent arsenic escaping into the trench and causing an electrical connection which could short-circuit subsequently deposited electrodes. Separate stand-alone pieces of semiconductor processing equipment, sometimes known as tools or chambers, are used to deposit layers using the above-mentioned LPCVD and CVD techniques, respectively.

The above description of the known process has been simplified, and the full process required to achieve the above-described structure has a relatively large number of complex steps.

SUMMARY OF THE INVENTION

It is therefore an object of the present invention to simplify the above process and therefore save manufacturing costs.

According to the present invention, there is provided a method of forming a buried plate for a semiconductor trench, comprising the steps of: depositing a first layer comprising a dopant; depositing a second layer of undoped material on the first layer; etching the first and second layers to a predetermined depth; annealing the first and second layers for out-diffusing the dopant onto the semiconductor trench, and removing the first and second layers, wherein the first layer is not exposed to air before the second layer is deposited thereon.

It is thus possible to provide a method of forming a buried plate where the formation of the undoped glass layer is carried out in the same semiconductor tool as that used for the LPCVD of the arsenic doped glass layer, thereby obviating the need for a separate semiconductor tool to carry out CVD of the undoped glass layer. The removal of the step requiring a plasma CVD chamber reduces manufacturing costs considerably, the overall processing time, and improves device performance characteristics.

Preferably, the first layer comprises arsenic doped glass. The second layer may comprise undoped glass.

More preferably, the arsenic doped glass is deposited using Tetra Ethyl Arsenate (TEAS) and undoped glass is deposited using Tetra Ethyl Ortho Silicate (TEOS).

Also, it has been discovered that an upper portion, relative to the bottom of the cavity of the trench, of the first layer may remain exposed after the etching step, without risking arsenic escaping into the trench.

FIGS. 1 to 7 are schematic diagrams of the various stages in the formation of a buried plate in a semiconductor trench constituting an embodiment of the invention;

Other objects, advantages and novel features of the present invention will become apparent from the following detailed description of the invention when considered in conjunction with the accompanying drawings.

DETAILED DESCRIPTION OF THE INVENT

Figure 1:
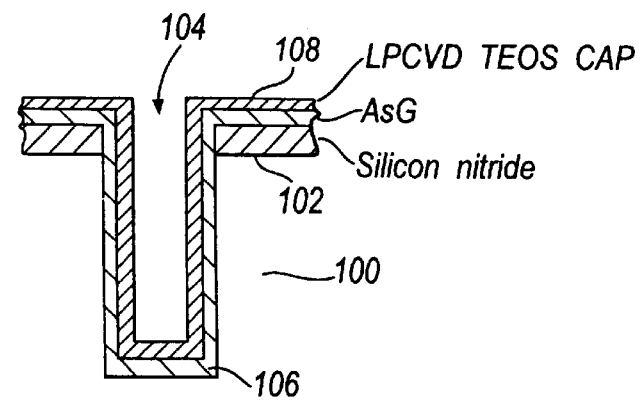
FIGS. 1 to 7 are schematic diagrams of the various stages in the formation of a buried plate in a semiconductor trench constituting an embodiment of the invention.
Figure 4:
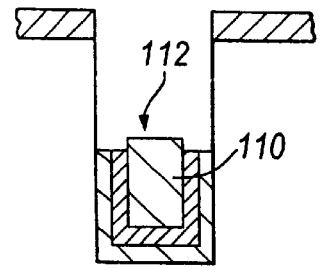

The following example relates to the formation of a buried plate trench capacitor. However, the method is equally applicable to any other device which may require the formation of a buried plate. Throughout the description identical reference numerals will be used to identify like parts.

Figure 9:
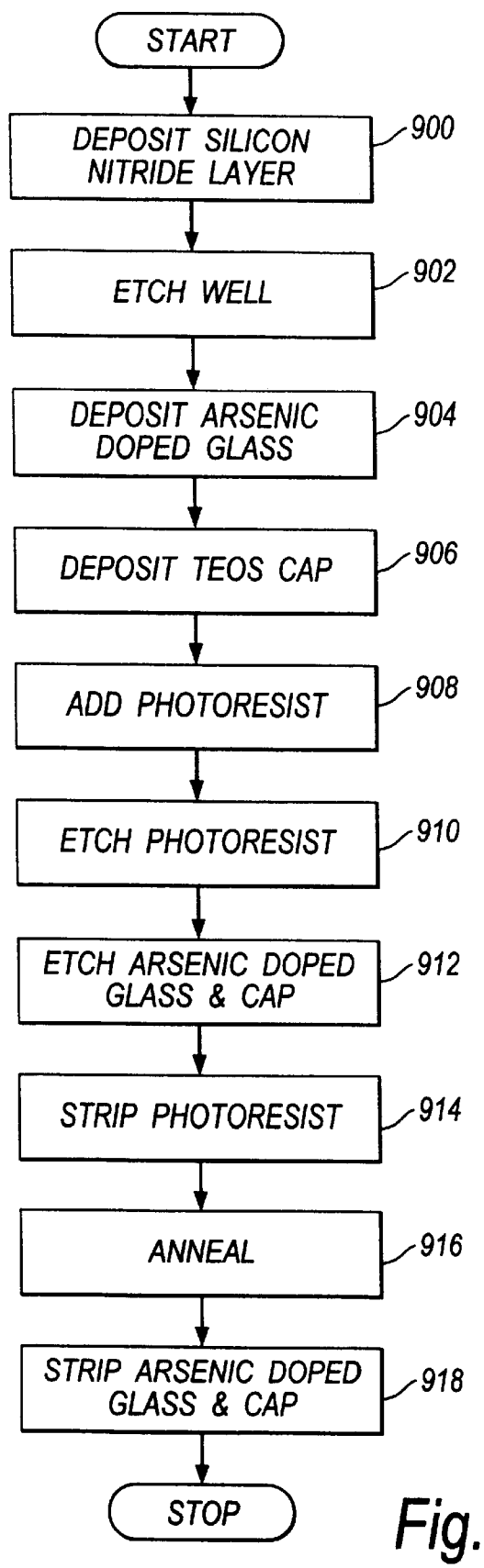
FIG. 9 is a flow diagram of a method corresponding to the stages of device formation shown in FIGS. 1 to 7.

Referring to FIGS. 1 and 9, a silicon nitride layer 102 is disposed (step 900) upon a semiconductor wafer, for example, a silicon wafer 100 and a trench 104 is formed (step 902) therein using any known technique in the art, for example, by plasma etching in a plasma etch processing chamber (not shown). An arsenic doped glass layer 106 is formed (step 904) within the trench 104 and over the silicon nitride layer 102 by LPCVD of the arsenic doped glass using Tetra Ethyl Arsenate (TEAS) in a LPCVD chamber (not shown). A second layer 108 of undoped glass is then deposited (step 906) on the first arsenic doped glass layer 106 by LPCVD using Tetra Ethyl Ortho Silicate (TEOS) in the same LPCVD chamber, the second layer 108 constituting a capping layer.

It should be appreciated that, in this example, the silicon wafer 100 is not removed from the LPCVD chamber between the formation of the arsenic doped glass layer 106 and the undoped glass layer 108, thereby preventing the arsenic doped layer 106 from being exposed to an element or elements which can unintentionally react with the arsenic in the arsenic doped glass layer 106, in particular, air.

Figure 2:
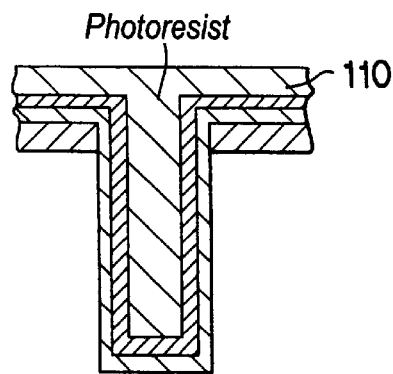

Referring to FIG. 2, the undoped glass layer 108 is covered with a layer of photoresist 110 (step 908) such that the photoresist fills the trench 104. The photoresist layer 110 is then etched (step 910) to a predetermined depth, for example 1.5 $\mu$m, using a plasma etching technique know in the art, the predetermined depth corresponding to the region in which the buried plate is to be formed.

The doped and undoped silicon oxide layers 106, 108 are then wet etched (step 912) from areas unprotected by the photoresist 110 in order to form a recess 112 within the trench 104.

Figure 5:
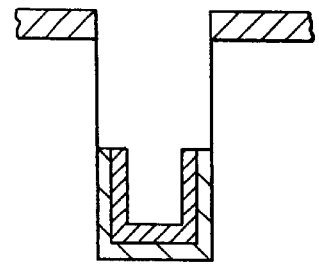
Figure 3:
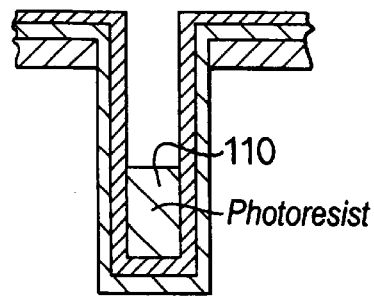
Figure 6:
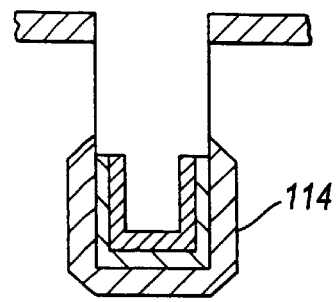

The remaining photoresist 110 is then stripped (step 914) using any suitable technique known in the art (FIG. 5), for example, wet etching or plasma etch techniques. Once the remaining photoresist 110 has been removed (FIG. 5), the device is annealed (step 916) in order to out-diffuse arsenic from the arsenic doped silicon oxide layer 106 (FIG. 6), thereby forming an arsenic doped region 114 which constitutes a buried plate.

Figure 7:
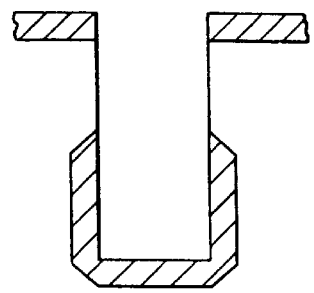
Figure 8:
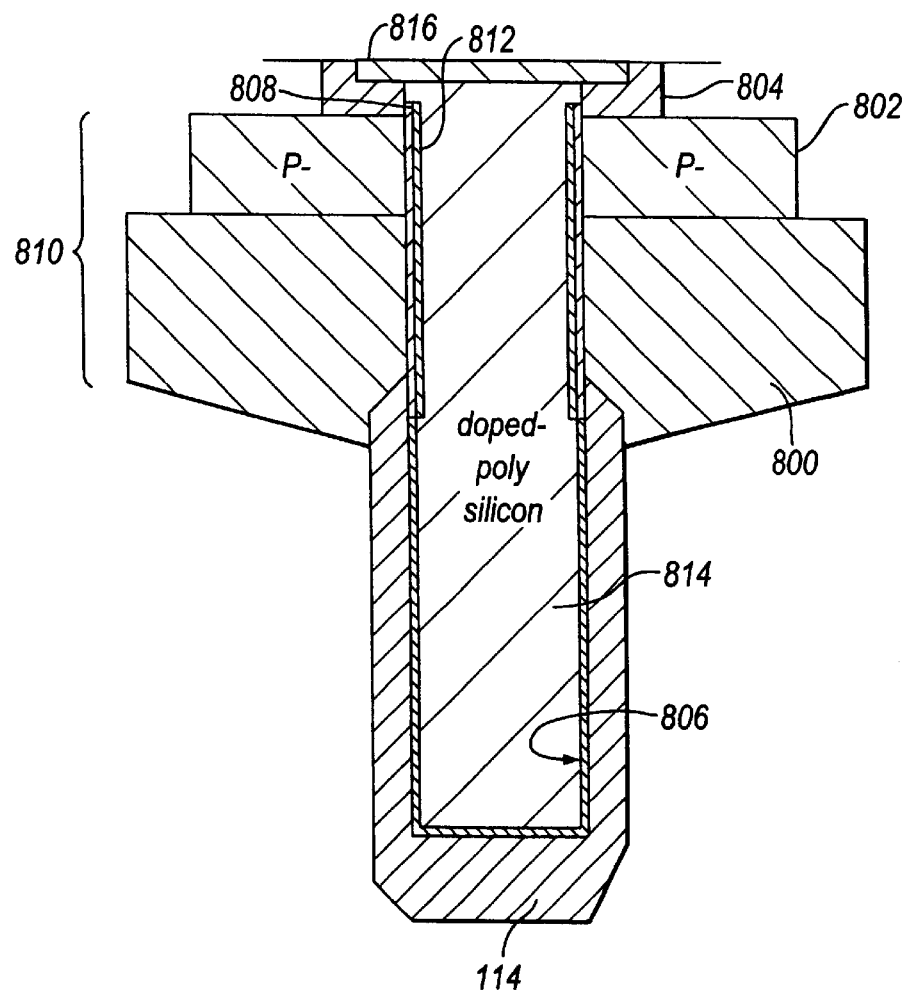
FIG. 8 is a schematic diagram of a device formed in accordance with the embodiment of FIGS. 1 to 7.

Referring to FIG. 7, the doped and undoped silicon oxide layers 106, 108 are then removed (step 918) using hydrofluoric acid.

The remaining features of the device shall be described briefly, but it should be appreciated that the formation of these features is known in the art.

An n-doped arsenic contact region 800, constituting a first isolation plate of the capacitor, is formed by ion implantation of arsenic, the size of the region being sufficient for the contact region 800 to contact the buried plate 114. The silicon nitride layer 102 is then removed and a p-doped layer 802 is formed above the contact region 802 by ion implantation of Boron atoms.

A first polysilicon strap layer 804 is then formed on the p-doped layer 802, followed by a dielectric layer 806 being deposited within the trench 104 substantially adjacent the arsenic doped region 114. A further polysilicon strap layer 808 is formed on an upper portion 810 of the trench 104 where there is no dielectric layer 806 has been formed; a silicon dioxide layer 812 is formed on the further polysilicon strap layer 808. The trench 104 is then filled with arsenic doped polysilicon 814 which constitutes a second isolated plate of the capacitor.

The arsenic doped polysilicon 814 is then etched to form a recess (not shown) in which a silicon dioxide isolation cap 816 is formed.

Although a specific example of a trench storage capacitor has been described above, it should be appreciated that other modifications and variations within the scope of the appended claims are envisaged.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method of forming a buried plate for a semiconductor trench, comprising the steps of:

depositing a first layer comprising a dopant;

depositing a second layer of undoped material on the first layer;

etching the first and second layers to a predetermined depth, such that after said etching an upper portion of said first layer relative to a bottom of said trench, is exposed;

with said upper portion exposed, annealing the first and second layers for out-diffusing the dopant onto the semiconductor trench; and removing the first and second layers, wherein the first layer is not exposed to air before the second layer is deposited thereon.

2. A method as claimed in claim 1, wherein the first layer comprises arsenic doped glass.

3. A method as claimed in claim 1, wherein the second layer comprises undoped glass.

4. A method as claimed in claim 2, wherein the arsenic doped glass is deposited using Tetra Ethyl Arsenate (TEAS).

5. A method as claimed in claim 3, wherein the undoped glass is deposited using Tetra Ethyl Ortho Silicate (TEOS).

6. A method as claimed in 1, wherein after the etching step, an upper portion relative to the bottom of the trench, of the first layer is exposed.

* * * * *